(12) United States Patent
Chou

(10) Patent No.: US 9,613,820 B1
(45) Date of Patent: Apr. 4, 2017

(54) METHOD OF FORMING PATTERNS

(71) Applicant: INOTERA MEMORIES, INC., Taoyuan (TW)

(72) Inventor: Kuo-Yao Chou, Taichung (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 15/069,936

(22) Filed: Mar. 14, 2016

(51) Int. Cl.
*G03F 7/004* (2006.01)
*H01L 21/308* (2006.01)
*H01L 21/027* (2006.01)
*H01L 21/02* (2006.01)
*H01L 21/311* (2006.01)
*H01L 21/3213* (2006.01)
*G03F 7/00* (2006.01)
*B81C 1/00* (2006.01)
*G03F 7/20* (2006.01)

(52) U.S. Cl.
CPC ...... *H01L 21/3081* (2013.01); *B81C 1/00031* (2013.01); *G03F 7/0002* (2013.01); *G03F 7/0035* (2013.01); *G03F 7/2016* (2013.01); *H01L 21/0273* (2013.01); *H01L 21/02118* (2013.01); *H01L 21/02318* (2013.01); *H01L 21/3086* (2013.01); *H01L 21/31144* (2013.01); *H01L 21/32139* (2013.01); *B81C 2201/0149* (2013.01)

(58) Field of Classification Search
CPC ...... G03F 7/002; G03F 7/0035; G03F 7/2016; G03F 7/2016; H01L 21/0271; H01L 21/31144; H01L 21/0337; H01L 21/033; B81C 1/00031; B81C 2201/0149

USPC ........ 430/322, 323, 324, 330; 438/311, 780, 438/947; 216/41
See application file for complete search history.

(56) References Cited

U.S. PATENT DOCUMENTS

| | | | |
|---|---|---|---|
| 9,418,860 B2* | 8/2016 | Somervell | G03F 7/42 |
| 2004/0121597 A1 | 6/2004 | Chung | |
| 2013/0099362 A1* | 4/2013 | Kim | B81C 1/00031 257/623 |
| 2014/0127910 A1* | 5/2014 | Hieno | H01L 21/3081 438/703 |
| 2014/0315390 A1* | 10/2014 | Abdallah | H01L 21/3081 438/703 |

FOREIGN PATENT DOCUMENTS

TW 201511083 A 3/2015

* cited by examiner

*Primary Examiner* — Amanda C Walke
(74) *Attorney, Agent, or Firm* — Winston Hsu; Scott Margo (57) ABSTRACT

A method of forming patterns includes the steps of providing a substrate having a target layer thereon; forming a plurality of first resist patterns on the target layer; depositing a directed self-assembly (DSA) material layer in a blanket manner on the first resist patterns, wherein the DSA material layer fills up a gap between the first resist patterns; subjecting the DSA material layer to a self-assembling process so as to form repeatedly arranged block copolymer patterns in the DSA material layer; and removing undesired portions from the DSA material layer to form second resist patterns on the target layer.

9 Claims, 14 Drawing Sheets

METHOD OF FORMING PATTERNS

BACKGROUND OF THE INVENTION

1. Field of the Invention

The present invention relates generally to a method of forming patterns, and more particularly to directed self-assembly (DSA) pattern formation in the semiconductor fabricating process.

2. Description of the Prior Art

As dimensions of semiconductor devices continue to shrink, the demand for the resolution of a photolithographic process goes up correspondingly. Typically, photolithography involves passing light through a reticle and focusing the light onto a photochemically-active photoresist material. By directing light or radiation through the reticle, the pattern in the reticle may be focused on the photoresist. The light or radiation causes a chemical change in the illuminated parts of the photoresist, which allows those parts to be selectively retained or removed, depending upon whether positive or negative photoresist is used, relative to parts which were in the shadows. Thus, the exposed and unexposed parts form a pattern in the photoresist.

Because the resolution of a photolithographic process is dependent upon wavelength of a light source used in the photo-exposure, the mask patterns obtained by conducting a photolithographic process must be separated from each other by a minimum distance. After being developed, the photoresist acts as a mask to transfer a pattern to an underlying material. The photoresist is sufficiently robust to withstand the development step without deforming and is also sufficiently robust to withstand an etching process for transferring the mask pattern to an underlying material. However, the photoresist layer must also have a thickness sufficient to resist etching. Hence, miniaturization of device can hardly be achieved by reducing thickness of the photoresist layer directly.

Therefore, there is a need in this technical field to provide an improved method for forming patterns, which is capable of minimizing the limitations in photolithographic and etching processes without increasing the complexity of the fabrication process.

SUMMARY OF THE INVENTION

The present disclosure is directed to provide an improved method of forming patterns that is capable of minimizing the limitation of the present photolithographic and etching processes and increasing the pattern resolution of semiconductor manufacturing processes.

In one aspect of the disclosure, a method of forming patterns is disclosed. A substrate having a target layer thereon is provided. A plurality of first resist patterns is formed on the target layer. A directed self-assembly (DSA) material layer is deposited in a blanket manner on the first resist patterns. The DSA material layer fills up a gap between adjacent two of the first resist patterns. The DSA material layer is then subjected to a self-assembling process so as to form repeatedly arranged block copolymer patterns in the DSA material layer. The undesired portions from the DSA material layer are removed to form second resist patterns on the target layer.

According to one embodiment of the disclosure, each of the first resist patterns has a width that is equal to a width of the gap. According to another embodiment of the disclosure, each of the first resist patterns has a width that is not equal to a width of the gap.

According to one embodiment of the disclosure, the DSA material layer comprises block copolymers. The self-assembling process is performed at a temperature lower than a glass transition temperature (Tg) of the block copolymers.

According to one embodiment of the disclosure, the method of forming patterns further comprises a step of performing an etching process to transfer the second resist patterns to the target layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 13 are diagrams illustrating an exemplary method for forming patterns according to embodiments of the invention, wherein

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

The term substrate used herein includes any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. The term substrate includes doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of the substrate, regardless of its orientation. Terms, such as "on", "above", and "under", are defined with respect to the horizontal plane.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

Please refer to FIG. 1 to FIG. 13. FIG. 1 to FIG. 13 are diagrams illustrating an exemplary method for forming patterns according to embodiments of the invention.

Figure 1A:
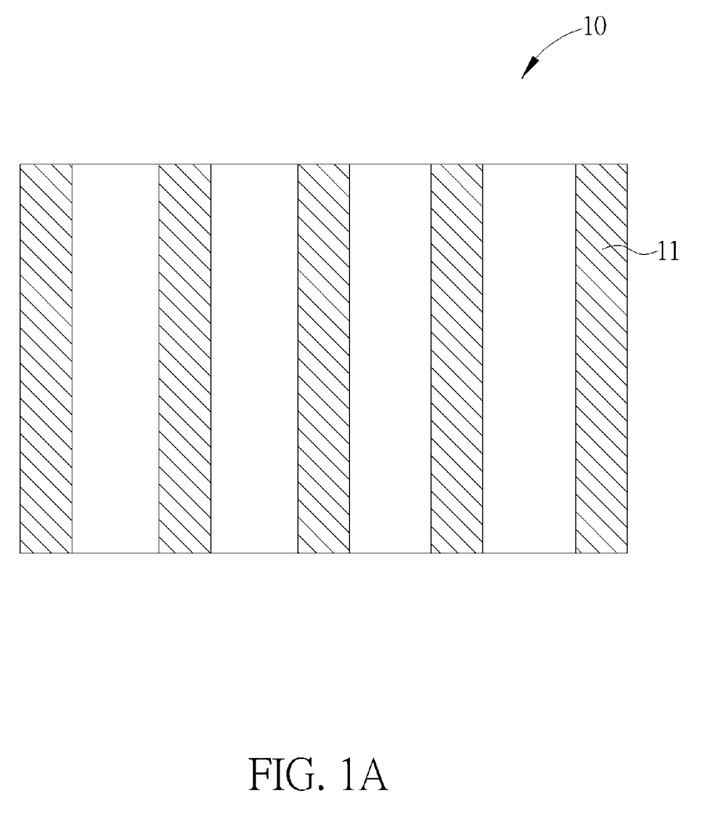
FIG. 1A is a top view of the reticle.
Figure 1B:
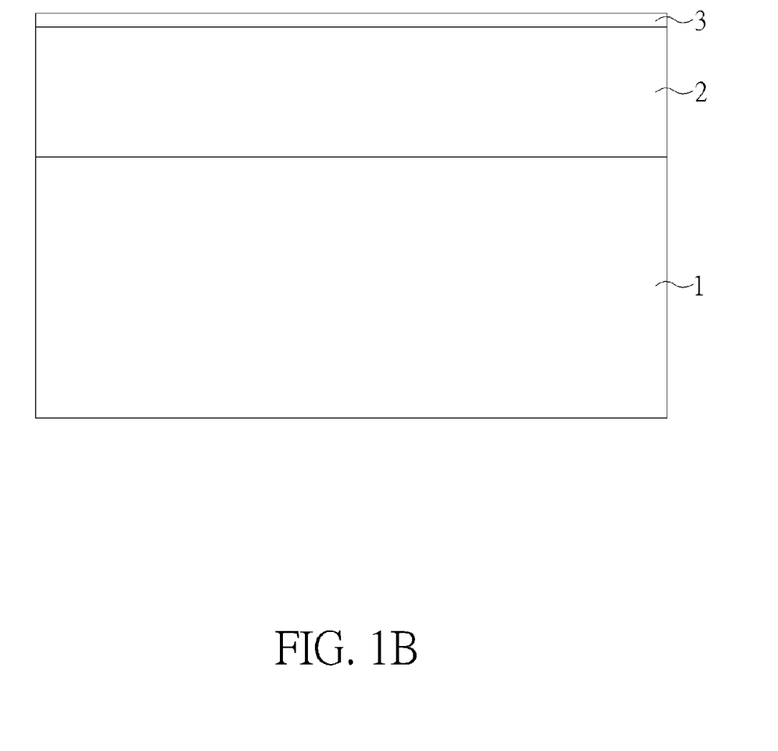
FIG. 1B is a cross-sectional view of a semiconductor structure according to one embodiment of the invention.

FIG. 1A is a top view of the reticle. When viewed from above, the reticle 10 has a line-shaped pattern 11. FIG. 1B is a cross-sectional view of a semiconductor structure according to one embodiment of the invention. First, as shown in FIG. 1B, a substrate 1 is provided. A target layer 2 and a photoresist layer 3 are sequentially formed on a horizontal major surface of the substrate 1. For example, the substrate 1 may comprise a silicon substrate, but is not limited thereto. The target layer 2 may comprise silicon oxide, silicon nitride, silicon, or polysilicon, but is not limited thereto. The photoresist layer 3 has an ultra-thin thickness, for example, about 0.01~0.05 micrometers (10~50 nm), to relax the limitations when the photoresist layer 3 is patterned in a photolithographic process.

Figure 2:
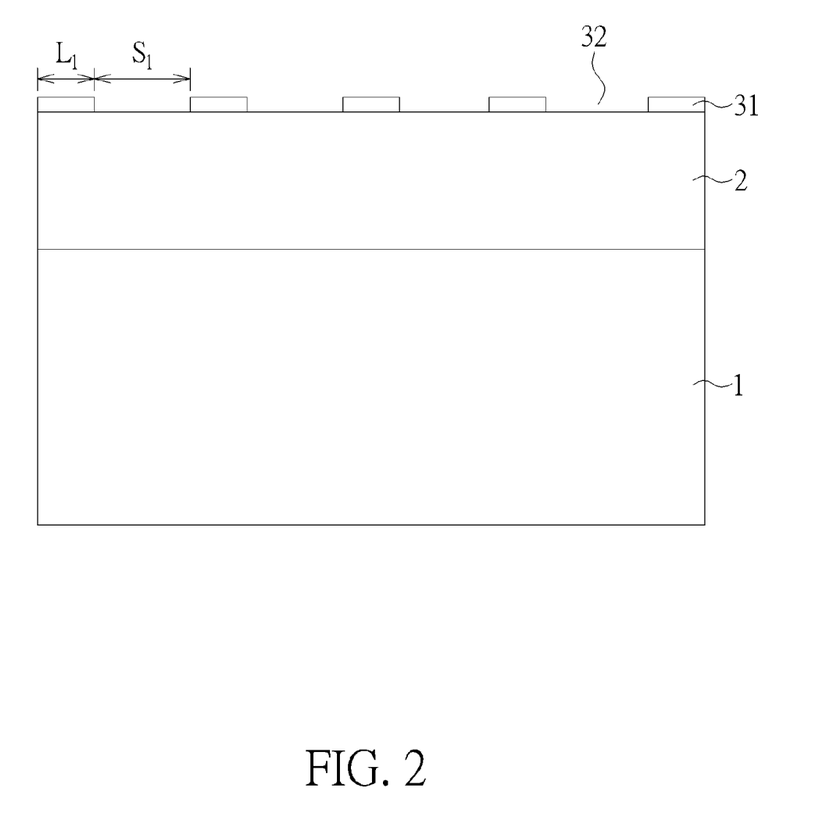
FIG. 2 is a cross-sectional view of the semiconductor structure in FIG. 1B after forming a plurality of first resist patterns according to one embodiment of the invention.

FIG. 2 is a cross-sectional view of the semiconductor structure in FIG. 1B after forming a plurality of first resist patterns according to one embodiment of the invention. As shown in FIG. 2, a lithography process including, but not limited to, exposure and development, is performed to remove parts of the photoresist layer 3, thereby forming a plurality of first resist patterns 31 on the target layer 2. During the exposure process, the reticle as shown in FIG. 1 is used. The first resist patterns 31 therefore conform to the patterns on the reticle as shown in FIG. 1.

According to the embodiment of the invention, when viewed from the above, the first resist patterns 31 are parallel to one another and have generally straight stripe (or line-shaped) patterns. Each of the first resist patterns 31 has a width $L_1$ and a gap 32 between adjacent two of the first resist patterns 31 has a width $S_1$. According to the embodiment of the invention, each of the first resist patterns 31 has a width $L_1$ that is equal to a width $S_1$ of the gap 32 ($L_1=S_1$). However, it is understood that in some embodiments each of the first resist patterns 31 has a width $L_1$ that is not equal to a width $S_1$ of the gap 32 ($L_1 \neq S_1$), for example, $L_1<S_1$.

Figure 3:
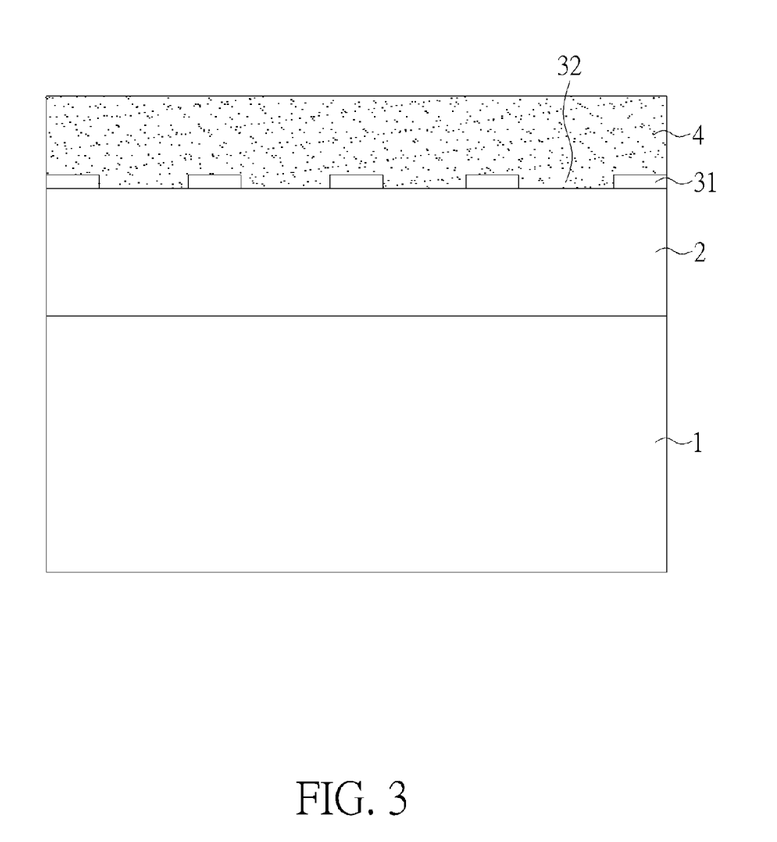
FIG. 3 is a cross-sectional view of the semiconductor after coating a directed self-assembly (DSA) material layer according to one embodiment of the invention.

As shown in FIG. 3, subsequently, a directed self-assembly (DSA) material layer 4 is coated onto the target layer 2. For example, the DSA material layer 4 may be coated by spin-on coating, spin casting, brush coating or vapor deposition. According to the embodiment of the invention, the DSA material layer 4 may comprise two or more immiscible compounds or a self-assembling compound comprising at least two components having distinct characteristics, such as functionality, polarity, water affinity, etch resistance, etc., which allows segregation and alignment of the two compounds or components in a reasonable manner, as well as selective removal of one compound or component.

According to the embodiment of the invention, the DSA material layer 4 may comprise block copolymers of at least two different polymers. Block copolymers are particularly well-suited for DSA techniques because they can be synthesized to include at least two distinct blocks allowing for each component to align under appropriate conditions, and be selectively removed after alignment. According to the embodiment of the invention, for example, the block copolymers may comprise polystyrene (PS) and poly(methyl methacrylate) (PMMA), but is not limited thereto.

Figure 4:
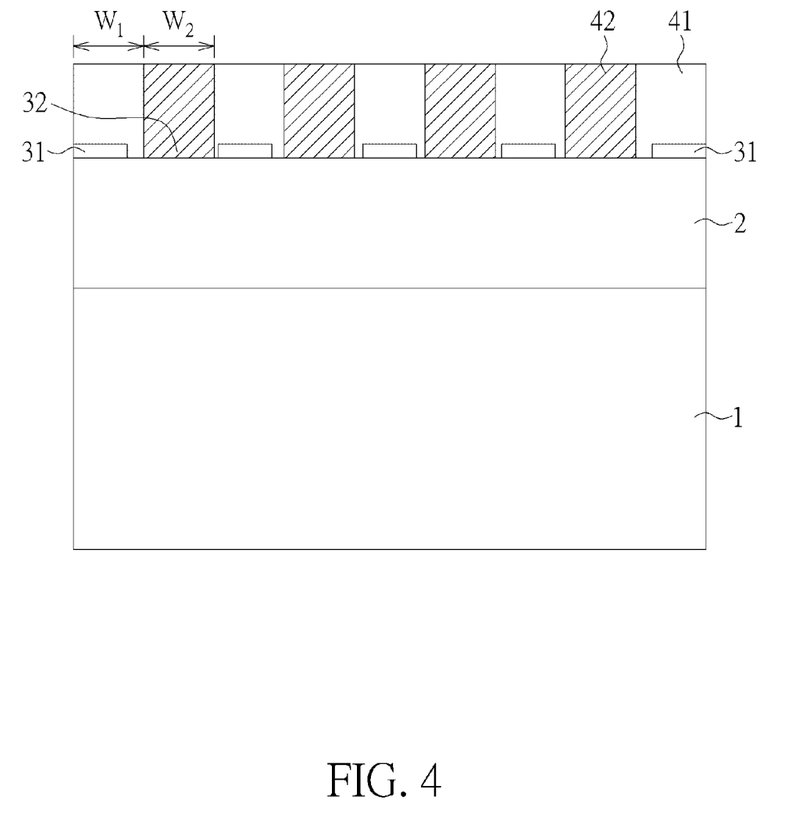
FIG. 4 is a cross-sectional view of the semiconductor after performing self-assembling process of the DSA material layer according to one embodiment of the invention.

Subsequently, as shown in FIG. 4, a self-assembling process of the DSA material layer 4 is performed to form first and second block copolymer patterns 41 and 42 repeatedly and alternately arranged corresponding to the first resist patterns 31 and the gap 32 on the target layer 2. The first resist patterns 31 can provide the interface for DSA material layer 4 to do a self-assembling process. The self-assembling process may comprise an annealing process, but is not limited thereto. The first block copolymer patterns 41 of the DSA material layer 4 are formed directly above the first resist patterns 31. The second block copolymer patterns 42 of the DSA material layer 4 are formed directly above the gap 32 between adjacent two of the first resist patterns 31. The first block copolymer patterns 41 and the second copolymer patterns 42 are repeatedly and alternately arranged along the widthwise direction of the line-shaped first resist patterns 31. The widthwise direction is perpendicular to the lengthwise direction along which the first resist patterns 31 extend. According to the embodiment of the invention, the first block copolymer patterns 41 may have a width $W_1$ that is equal to a width $W_2$ of the second block copolymer patterns 42 ($W_1=W_2$), but is not limited thereto.

The self-assembling process may be facilitated and accelerated by heating to sufficient temperatures. The temperature may be chosen to be sufficiently low to prevent adversely affecting the block copolymers or the semiconductor devices fabricated in the substrate 1. According to the embodiment of the invention, the self-assembling process is performed at a temperature lower than a glass transition temperature (Tg) of the block copolymers in the DSA material layer 4. The repeatedly and alternately arranged block copolymer patterns 41 and 42 may serve as an etch resist mask for patterning the underlying layers.

Figure 5:
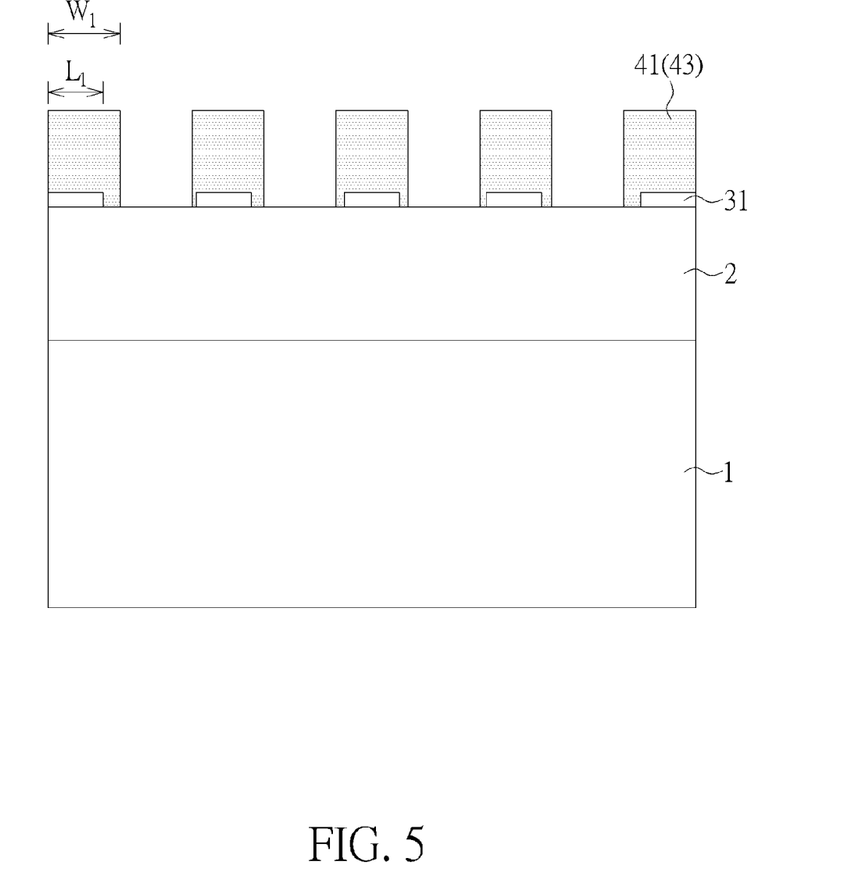
FIG. 5 is a cross-sectional view of the semiconductor structure after removing undesired portions from the DSA material layer to form second resist patterns according to embodiments of the invention.

FIG. 5 is a cross-sectional view of the semiconductor structure after removing undesired portions from the DSA material layer to form second resist patterns according to embodiments of the invention. As shown in FIG. 5, the undesired portions, for example, the second block copolymer patterns 42 directly positioned on gap 32 between adjacent two of the first resist patterns 31, are removed from DSA material layer 4, while leaving the first block copolymer patterns 41 intact.

Because the first block copolymer patterns 41 and the second block copolymer patterns 42 have distinct characteristics, the second block copolymer patterns 42 can be selectively removed so that the remaining first block copolymer patterns 41 form second resist patterns 43. For example, the first block copolymer patterns 41 may have a first etch rate with respect to a wet or dry etchant, while the second block copolymer patterns 42 may have a second etch rate in the same wet or dry etchant, wherein the first and second etch rates are different from each other. In particular, the first etch rate may be higher than the second etch rate depending upon the etchant used. Thus, a suitable etchant can be chosen to selectively remove the second block copolymer patterns 42 thereby leaving the first block copolymer patterns 41 substantially intact on the target layer 2 to form the second resist patterns 43. According to the embodiment of the invention, the width $W_1$ may be greater than the width $L_1$ of each of the first resist patterns 31.

Figure 6:
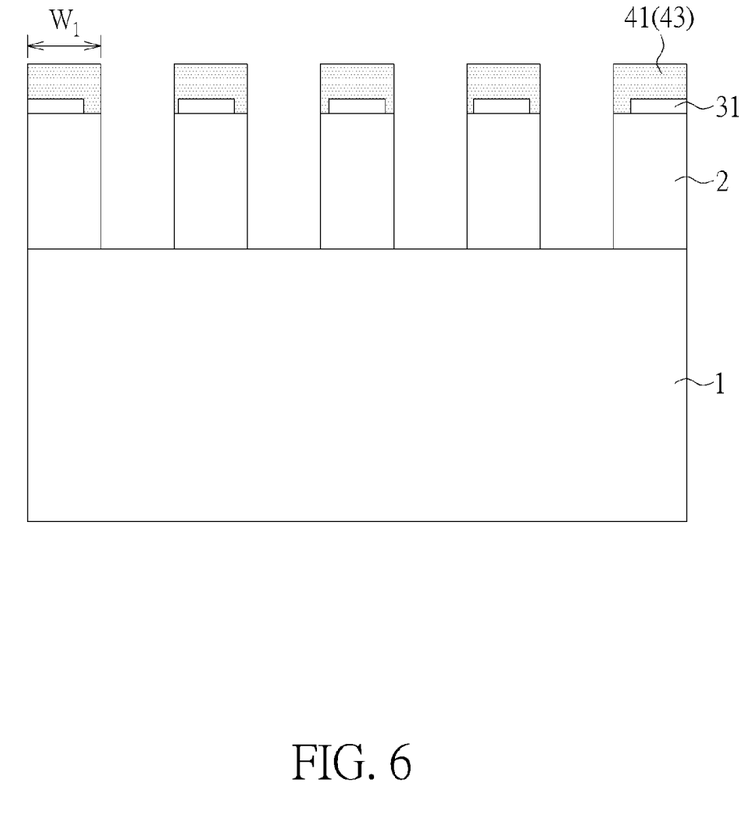
FIG. 6 is a cross-sectional view of the semiconductor structures of FIG. 5 after transferring the second resist patterns to the target layer according to one embodiment of the invention.

FIG. 6 is a cross-sectional view of the semiconductor structures of FIG. 5 after transferring the second resist patterns 43 to the target layer 2 according to one embodiment of the invention. As shown in FIG. 6, the second resist patterns 43 are used as an etch mask and an etching process such as a dry etching process is performed to transfer the second resist patterns 43 to the target layer 2.

Figure 7:
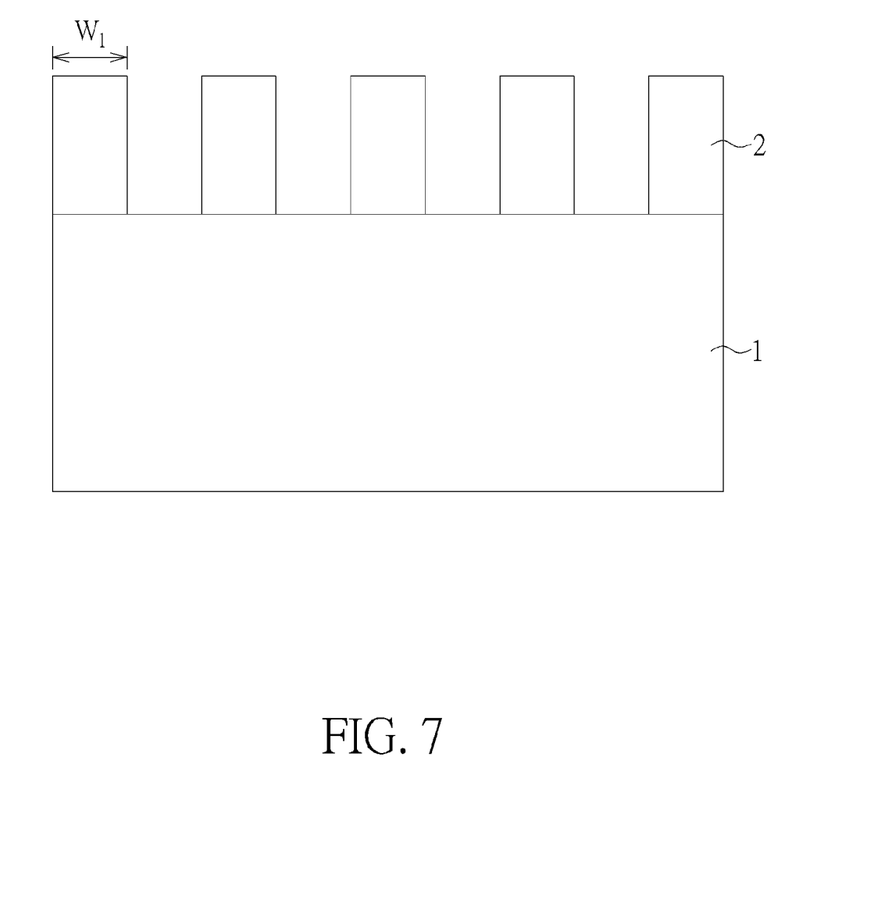
FIG. 7 is a cross-sectional view of the semiconductor structures of FIG. 6 after removing the first and second resist patterns according to one embodiment of the invention.

FIG. 7 is a cross-sectional view of the semiconductor structures of FIG. 6 after removing the first and second resist patterns 31 and 43 according to one embodiment of the invention. As shown in FIG. 7, another etching process such as a dry etching process is performed to remove the first and second resist patterns 31 and 43. It is noteworthy that the patterns in the target layer 2 have a width $W_1$ that is equal to the width $W_1$ of the first block copolymer patterns 41.

Figure 8:
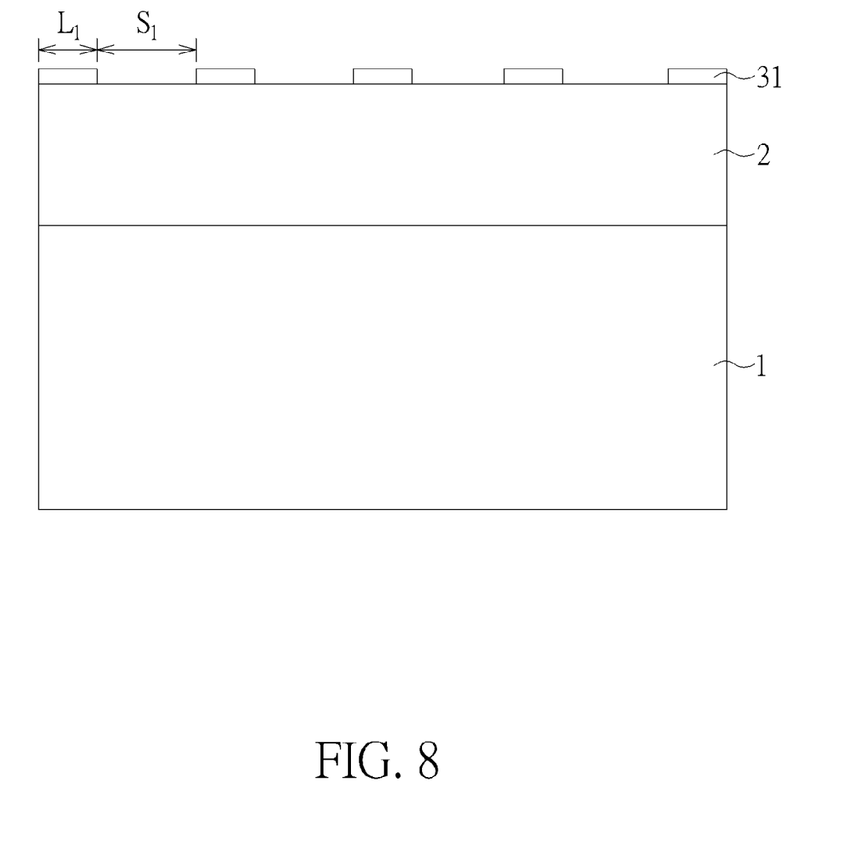
FIG. 8 is a cross-sectional view of the semiconductor structure in FIG. 1B after forming a plurality of first resist patterns according to another embodiment of the invention.

FIG. 8 is a cross-sectional view of the semiconductor structure in FIG. 1B after forming a plurality of first resist patterns 31 according to another embodiment of the invention. As shown in FIG. 8, a lithography process including, but not limited to, exposure and development, is performed to remove parts of the photoresist layer 3, thereby forming a plurality of first resist patterns 31 on the target layer 2. Likewise, each of the first resist patterns 31 have a width $L_1$ and a gap 32 between adjacent two of the first resist patterns 31 has a width $S_1$. According to the embodiment of the invention, each of the first resist patterns 31 has a width $L_1$ that is equal to a width $S_1$ of the gap 32 ($L_1=S_1$). However, it is understood that in some embodiments each of the first resist patterns 31 has a width $L_1$ that is not equal to a width $S_1$ of the gap 32 ($L_1 \neq S_1$), for example, $L_1 < S_1$.

Figure 9:
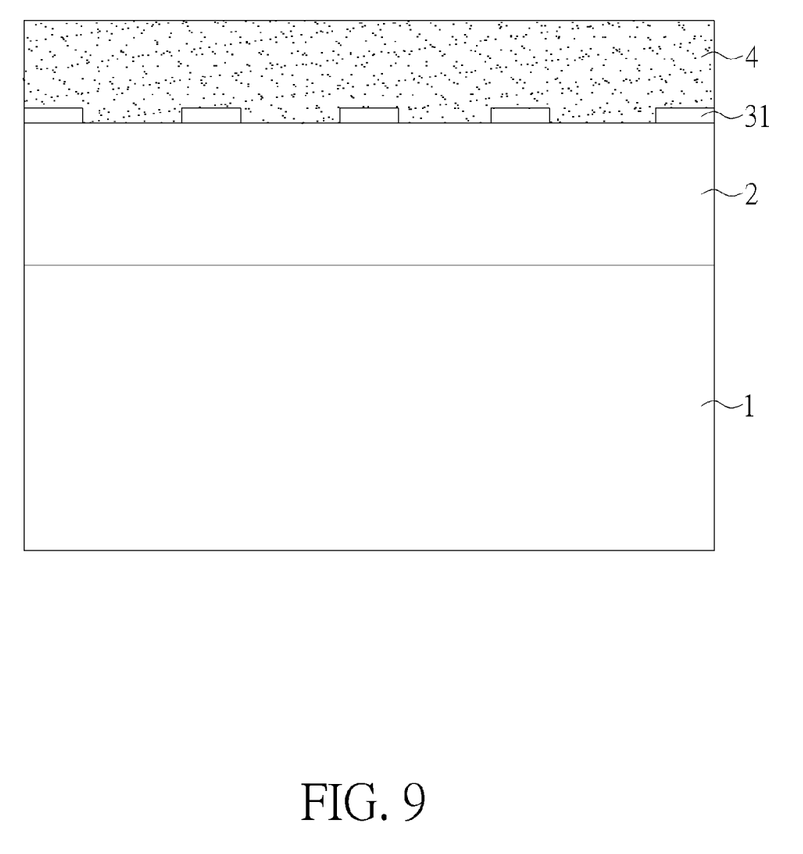
FIG. 9 is a cross-sectional view of the semiconductor after coating a directed self-assembly (DSA) material layer according to another embodiment of the invention.

FIG. 9 is a cross-sectional view of the semiconductor after coating a DSA material layer 4 according to another embodiment of the invention. The coating method is as described in the FIG. 3 and is not repeated herein. According to the embodiment of the invention, the DSA material layer 4 may comprise block copolymers of at least two different polymers, wherein the block copolymers may comprise polystyrene (PS) and poly(methyl methacrylate) (PMMA), but is not limited thereto.

It will be appreciated that the size of each block copolymer and the ratio of the constituent block copolymers may be chosen to facilitate self-assembling process and to form organized block domains having desired dimensions. A block copolymer having longer copolymers may be used to form larger domains and a block copolymer having shorter copolymers may be used to form smaller domains.

Figure 10:
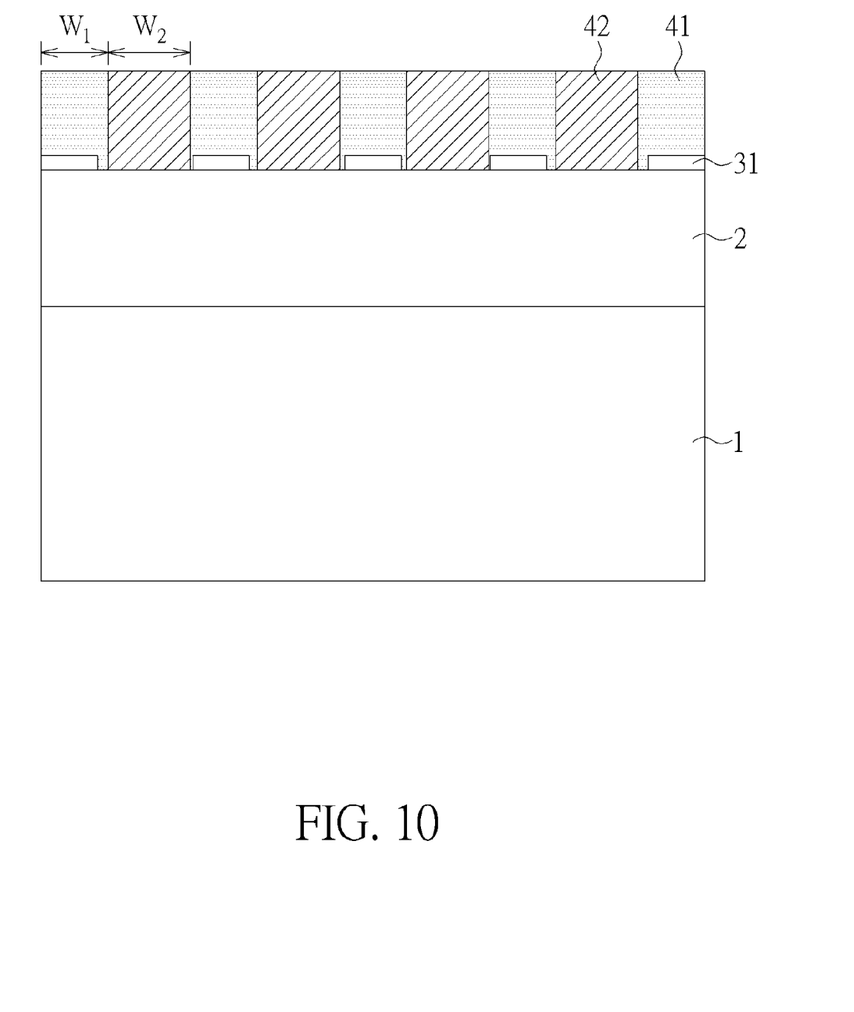
FIG. 10 is a cross-sectional view of the semiconductor after performing self-assembling process of the DSA material layer according to another embodiment of the invention.

FIG. 10 is a cross-sectional view of the semiconductor after performing self-assembling process of the DSA material layer 4 according to another embodiment of the invention. The treatment method is as described in FIG. 4 and is not repeated herein. A self-assembling process of the DSA material layer 4 is performed to form first and second block copolymer patterns 41 and 42 repeatedly and alternately arranged corresponding to the first resist patterns 31 and the gap 32 on the target layer 2.

It will be appreciated that the widths of the first and second block copolymer patterns 41 and 42 are basically determined by the chain sizes (or lengths) of the two different polymers of the block copolymers. According to the embodiment of the invention, the first block copolymer patterns 41 has a width $W_1$ that is not equal to a width $W_2$ of the second block copolymer patterns 42 ($W_1 \neq W_2$) for example, $W_1 < W_2$.

Figure 11:
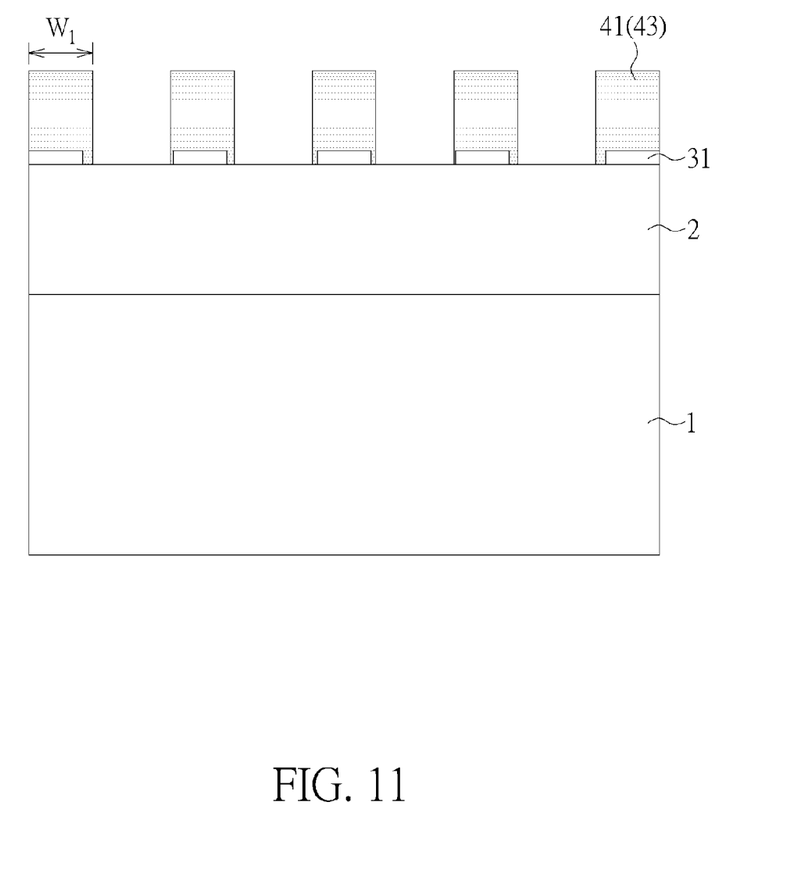
FIG. 11 is a cross-sectional view of the semiconductor structure after removing undesired portions from the DSA material layer to form second resist patterns according to another embodiment of the invention.

Subsequently, as shown in FIG. 11, the undesired portions, for example, each of the second block copolymer patterns 42 directly positioned on the gap 32 between adjacent two of the first resist patterns 31, are removed from DSA material layer 4, while leaving the first block copolymer patterns 41 intact to form the second resist patterns 43. The treatment method is as described in FIG. 5 and is not repeated herein. According to the embodiment of the invention, the width $W_1$ of the second resist patterns 43 is greater than the width $L_1$ of each of the first resist patterns 31.

Figure 12:
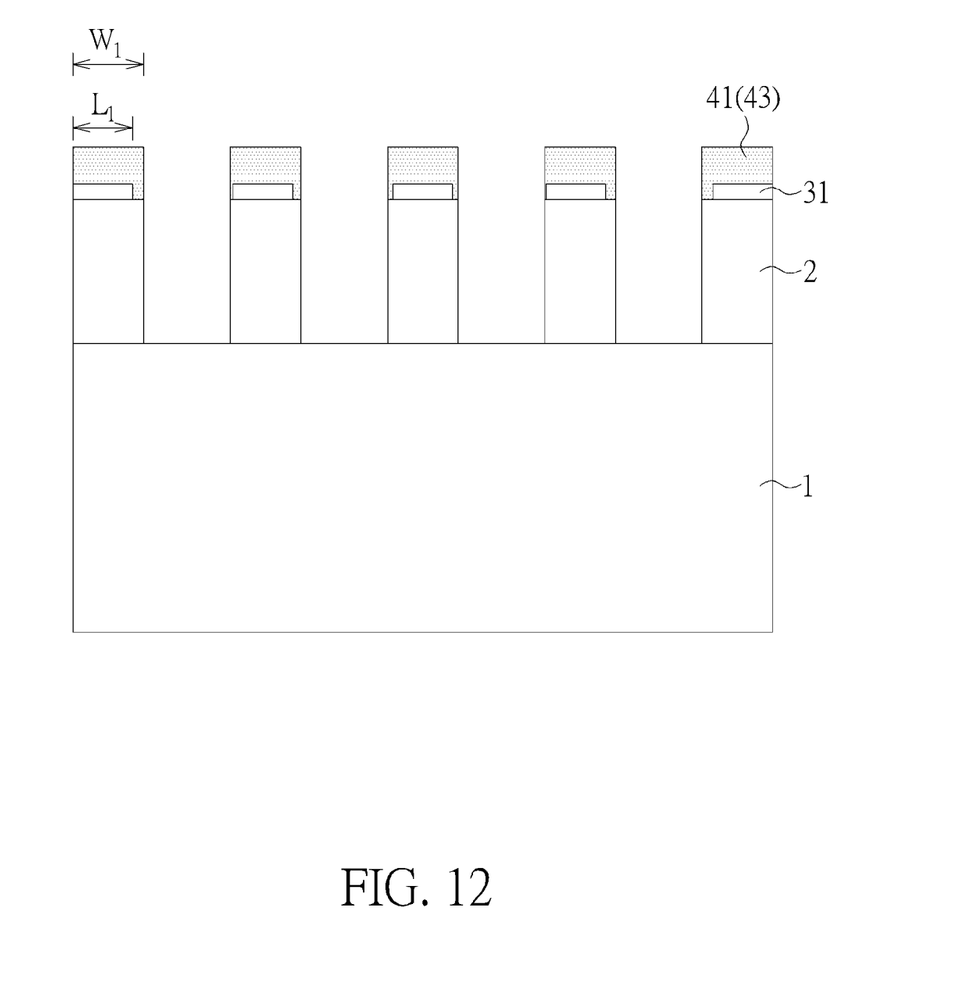
FIG. 12 is a cross-sectional view of the semiconductor structures of FIG. 11 after transferring the second resist patterns to the target layer according to another embodiment of the invention.

As shown in FIG. 12, subsequently, the second resist patterns 43 are used as an etch mask and an etching process such as a dry etching process is performed to transfer the second resist patterns 43 to the target layer 2.

Figure 13:
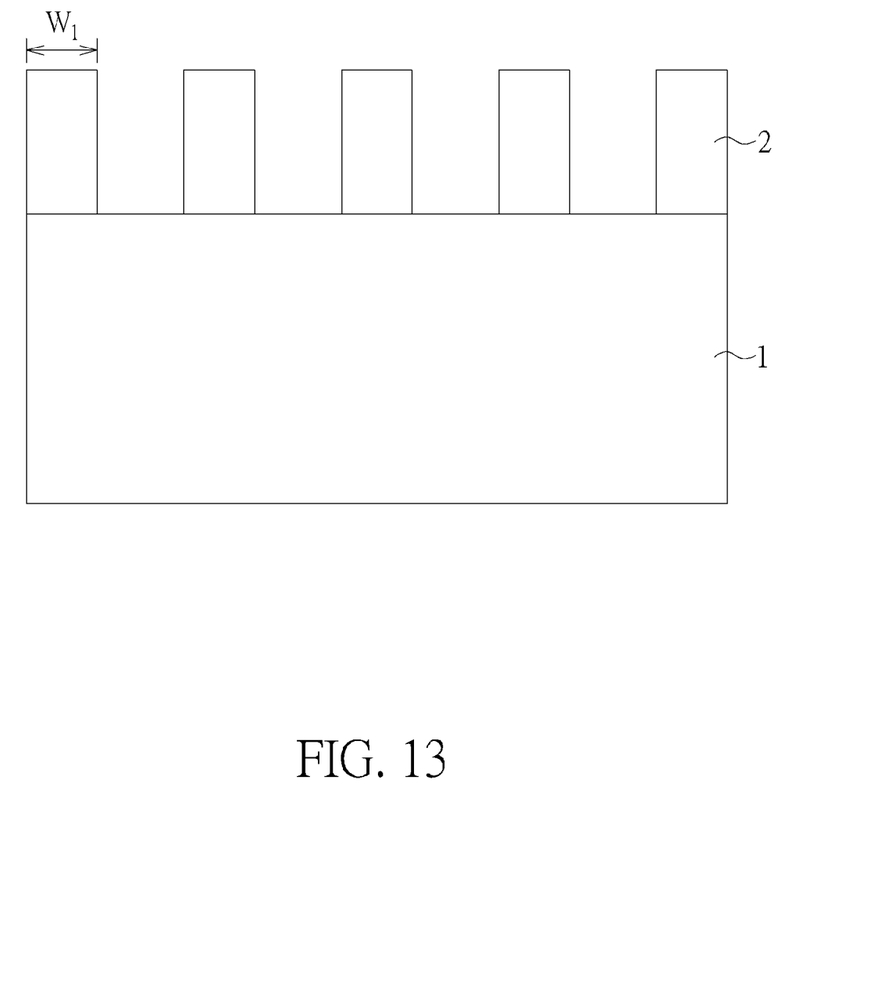
FIG. 13 is a cross-sectional view of the semiconductor structures of FIG. 12 after removing the first and second resist patterns according to another embodiment of the invention.

Finally, as shown in FIG. 13, another etching process such as a dry etching process is performed to remove the first and second resist patterns 31 and 43. It is noteworthy that each of the patterns in the target layer 2 has a width $W_1$ that is equal to the width $W_1$ of each of the first block copolymer patterns 41.

The ultra-thin photoresist layer 3 is fabricated so that the limitations in photolithographic process due to device miniaturization are eased. Although the ultra-thin photoresist layer 3 is too thin to resist etching, the second resist patterns 43 serve as an etching mask. Hence, the method is able to relax the limitations in a photolithographic process and to miniaturize devices at the same time.

To sum up, the present disclosure provides an improved method of forming patterns that is capable of minimizing the limitation of the present photolithographic and etching processes and increasing the pattern resolution of semiconductor manufacturing processes.

A method of forming patterns includes the steps of providing a substrate 1 having a target layer 2 thereon; forming a plurality of first resist patterns 31 on the target layer 2; depositing a directed self-assembly (DSA) material layer 4 in a blanket manner on the first resist patterns 31, wherein the DSA material layer 4 fills up a gap 32 between the first resist patterns 31; subjecting the DSA material layer 4 to a self-assembling process so as to form repeatedly arranged block copolymer patterns 41, 42 in the DSA material layer 4; and removing undesired portions 42 from the DSA material layer 4 to form second resist patterns 43 on the target layer 2.

According to one embodiment, each of the first resist patterns 31 has a width $L_1$ that is equal to a width $S_1$ of the gap 32. According to another embodiment, each of the first resist patterns 31 has a width $L_1$ that is not equal to a width $S_1$ of the gap 32.

The DSA material layer 4 may comprise block copolymers. According to one embodiment, the self-assembling process is performed at a temperature lower than a glass transition temperature (Tg) of the block copolymers.

The method of forming patterns further comprises a step of performing an etching process to transfer the second resist patterns 43 to the target layer 2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming patterns, comprising the steps of:
   providing a substrate having a target layer thereon;
   coating a photoresist layer onto the target layer;
   performing a photolithographic process to pattern the photoresist layer into a plurality of first resist patterns;
   depositing a directed self-assembly (DSA) material layer in a blanket manner on the first resist patterns, wherein the DSA material layer fills up gaps between the first resist patterns;
   subjecting the DSA material layer to a self-assembling process so as to form repeatedly arranged block copolymer patterns in the DSA material layer, wherein the repeatedly arranged block copolymer patterns are aligned corresponding to the first resist patterns and the gaps;
   removing undesired portions being not positioned directly above the first resist patterns from the DSA material layer to form second resist patterns on the target layer wherein the second resist patterns covers each of the plurality of first resist patterns; and
   using the second resist patterns and the plurality of first resist patterns together as an etch hard mask, performing an etching process to transfer the second resist patterns to the target layer.

2. The method of forming patterns according to claim 1, wherein the target layer comprises silicon oxide, silicon nitride, silicon, or polysilicon.

3. The method of forming patterns according to claim 1, wherein each of the first resist patterns has a width that is equal to a width of the gap.

4. The method of forming patterns according to claim 1, wherein each of the first resist patterns has a width that is not equal to a width of the gap.

5. The method of forming patterns according to claim 1, wherein the DSA material layer comprises block copolymers.

6. The method of forming patterns according to claim 5, wherein the block copolymers comprise polystyrene and poly(methyl methacrylate).

7. The method of forming patterns according to claim 6, wherein the self-assembling process is performed at a temperature lower than a glass transition temperature (Tg) of the block copolymers.

8. The method of forming patterns according to claim 1, wherein the undesired portions are the DSA material layer not directly positioned on the first resist patterns.

9. The of forming patterns according to claim 1, wherein the photoresist layer has a ultra-thin thickness ranging between 10~50 nanometers.

\* \* \* \* \*